(12) United States Patent
Keys et al.

(10) Patent No.: US 10,896,907 B2
(45) Date of Patent: Jan. 19, 2021

(54) RETROGRADE TRANSISTOR DOPING BY HETEROJUNCTION MATERIALS

(71) Applicant: Intel Corporation, Santa Clara, CA (US)

(72) Inventors: Patrick H. Keys, Portland, OR (US); Hei Kam, Fremont, CA (US); Rishabh Mehandru, Portland, OR (US); Aaron A. Budrevich, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/318,361

(22) PCT Filed: Sep. 30, 2016

(86) PCT No.: PCT/US2016/055034
§ 371 (c)(1),
(2) Date: Jan. 16, 2019

(87) PCT Pub. No.: WO2018/063407
PCT Pub. Date: Apr. 5, 2018

(65) Prior Publication Data
US 2019/0237466 A1 Aug. 1, 2019

(51) Int. Cl.
*H01L 27/092* (2006.01)
*H01L 21/8238* (2006.01)
(Continued)

(52) U.S. Cl.
CPC .. *H01L 27/0924* (2013.01); *H01L 21/823892* (2013.01); *H01L 29/1054* (2013.01);
(Continued)

(58) Field of Classification Search
CPC ..... H01L 27/0924; H01L 29/49; H01L 29/43; H01L 29/167; H01L 29/1054;
(Continued)

(56) References Cited

U.S. PATENT DOCUMENTS

2004/0075143 A1* 4/2004 Bae ................... H01L 21/76254
257/347
2008/0265321 A1 10/2008 Yu et al.
(Continued)

OTHER PUBLICATIONS

International Preliminary Report on Patentability for International Patent Application No. PCT/US2016/055034 dated Apr. 11, 2019, 11 pgs.
(Continued)

*Primary Examiner* — Mohammed R Alam
(74) *Attorney, Agent, or Firm* — Schwabe, Williamson & Wyatt, P.C.

(57) ABSTRACT

A transistor including a gate stack and source and drain on opposing sides of the gate stack; and a first material and a second material on the substrate, the first material disposed between the substrate and the second material and the channel of the transistor is defined in the second material between the source and drain, wherein the first material and the second material each include an implant and the implant includes a greater solubility in the first material than in the second material. A method for forming an integrated circuit structure including forming a first material on a substrate; forming a second material on the first material; introducing an implant into the second material, wherein the implant includes a greater solubility in the first material than in the second material; annealing the substrate; and forming a transistor on the substrate, the transistor including a channel including the second material.

18 Claims, 14 Drawing Sheets

(51) Int. Cl.
*H01L 29/66* (2006.01)
*H01L 29/78* (2006.01)
*H01L 29/10* (2006.01)
*H01L 29/167* (2006.01)
*H01L 29/43* (2006.01)
*H01L 29/49* (2006.01)

(52) U.S. Cl.
CPC ............ *H01L 29/167* (2013.01); *H01L 29/43* (2013.01); *H01L 29/49* (2013.01); *H01L 29/66795* (2013.01); *H01L 29/785* (2013.01); H01L 27/092 (2013.01)

(58) Field of Classification Search
CPC ............. H01L 29/785; H01L 29/66795; H01L 21/823892; H01L 27/092; H01L 29/78612; H01L 29/78609; H01L 29/78621; H01L 29/78687
See application file for complete search history.

(56) References Cited

U.S. PATENT DOCUMENTS

| | | | |
|---|---|---|---|
| 2014/0361377 A1* | 12/2014 | Jacob | H01L 29/66795 257/369 |
| 2015/0140761 A1 | 5/2015 | Jacob et al. | |
| 2015/0221761 A1 | 8/2015 | Tan et al. | |
| 2015/0243505 A1 | 8/2015 | Wang et al. | |
| 2016/0071979 A1 | 3/2016 | Jacob et al. | |
| 2016/0181394 A1* | 6/2016 | Kerber | H01L 29/66522 257/327 |

OTHER PUBLICATIONS

International Search Report and Written Opinion for International Patent Application No. PCT/US2016/055034 dated Jun. 26, 2017, 14 pgs.

* cited by examiner

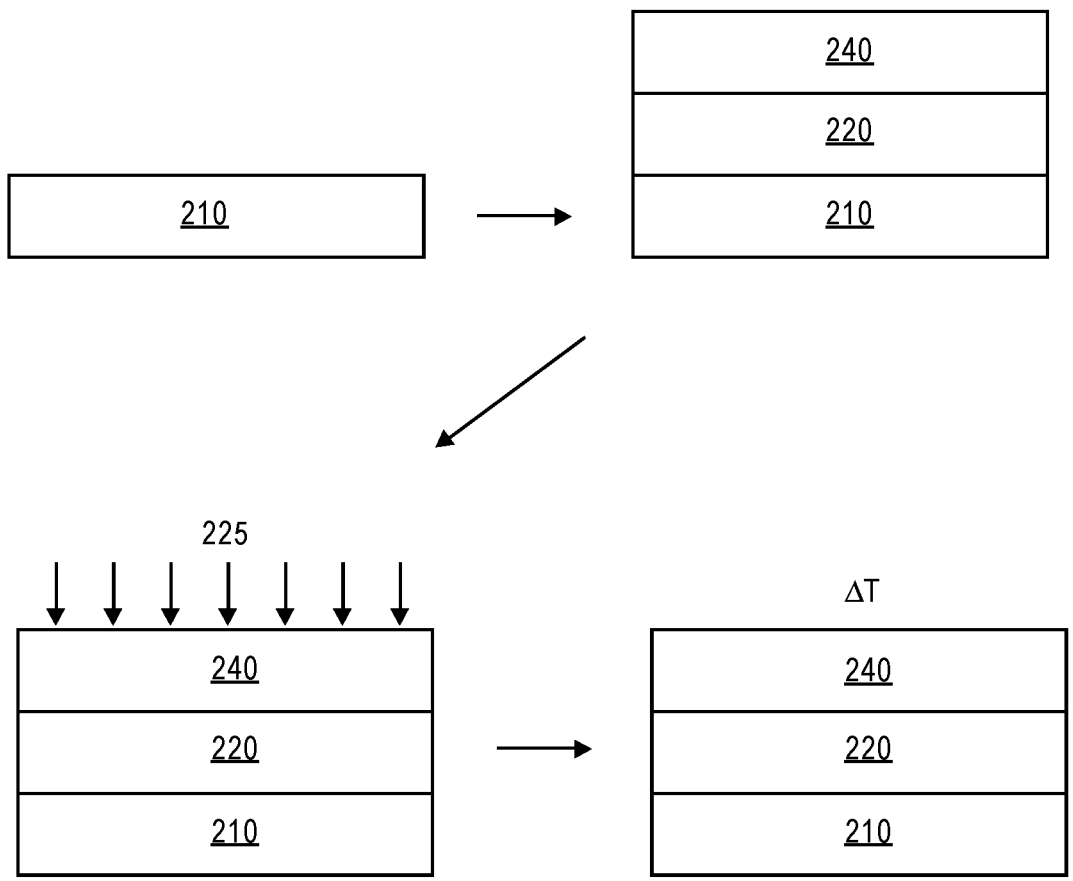
FIG. 3
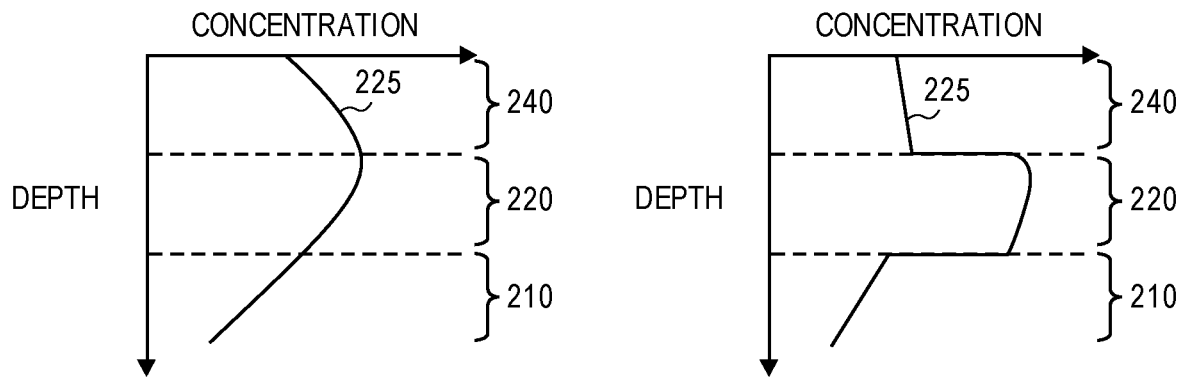
FIG. 4
FIG. 5

US 10,896,907 B2

RETROGRADE TRANSISTOR DOPING BY HETEROJUNCTION MATERIALS

CROSS-REFERENCE TO RELATED APPLICATION

This patent application is a U.S. National Phase Application under 35 U.S.C. § 371 of International Application No. PCT/US2016/055034, filed Sep. 30, 2016, entitled "RETROGRADE TRANSISTOR DOPING BY HETEROJUNCTION MATERIALS," which designates the United States of America, the entire disclosure of which is hereby incorporated by reference in its entirety and for all purposes.

BACKGROUND

Field

Integrated circuit devices.

Description of Related Art

As semiconductors become more complex and transistors become smaller and smaller, power consumption and heat have become limiting factors to the continued pace of chip design and manufacturing. As millions, or even billions, of smaller and faster transistors get packed on to a single chip the size of a thumbnail, power consumption and the amount of heat generated in the processor core becomes a significant technical challenge. In particular, as chip densities increase, off-state current leakage requires more power and generates more heat, and may present a limit to chip size and integration.

One technique for reducing off-state leakage current is to form a well of dopant in the channel between the source and drain regions of the transistor. For example, in an N-type metal oxide semiconductor device (an NMOS device), boron may be implanted into the channel using halo, or pocket, implant methods. Similarly, in a PMOS device, phosphorus may be implanted into the channel using such implant methods. During the source drain anneal, the implanted boron (in an NMOS device) or phosphorus (in a PMOS device) diffuses throughout the channel to form a well having a relatively uniform concentration of boron or phosphorus for some depth below the gate. Such a well (conventional well) generally affects the resistance of the channel between the source and drain in two ways. The dopant that diffuses into the channel can increase the resistance of the channel, thus reducing the drive current (on-state) and the higher doping below the source/drain and channel improves confinement such that off-state leakage current (in other words, leakage current between the source and drain when the transistor is off) is reduced.

BRIEF DESCRIPTION OF THE DRAWINGS

FIG. 3 presents a process flow for forming a retrograde layer and an intrinsic layer on a substrate and doping the layers with a well dopant.

FIG. 4 shows an initial concentration profile of a well implant that favors well implant migration to the retrograde layer of FIG. 3 with enough concentration of a well implant in the intrinsic layer of FIG. 3 so that the profile resembles a bell curve.

FIG. 5 shows the concentration profile of the well implant in the retrograde and intrinsic layers of FIG. 3 following an anneal.

DETAILED DESCRIPTION

Figure 1:
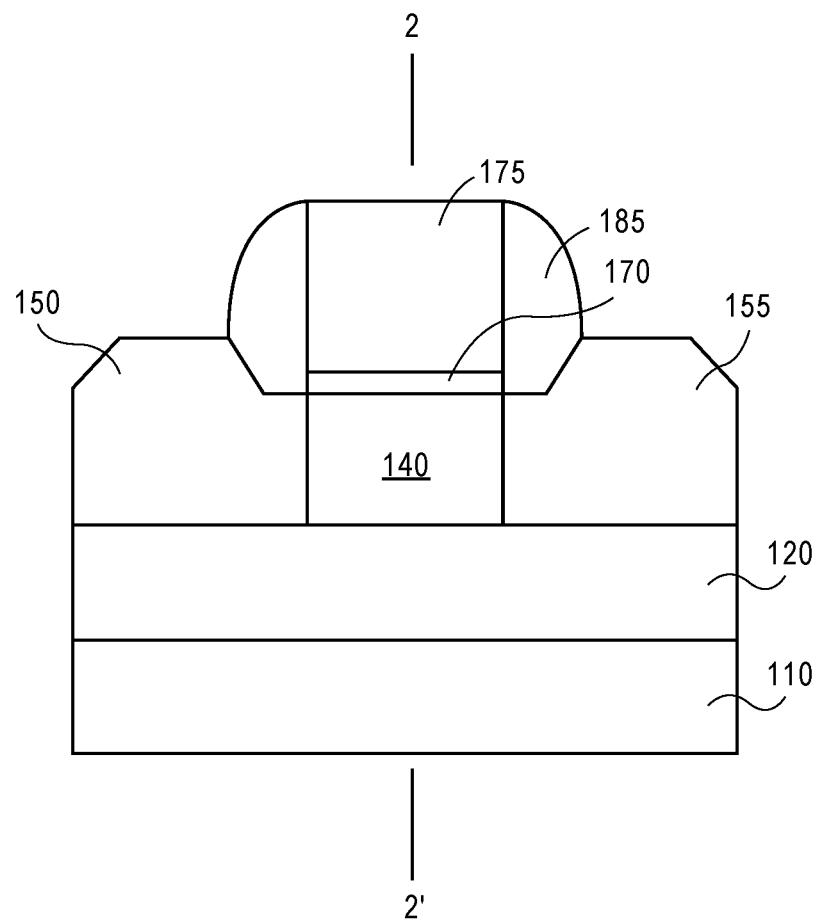
FIG. 1 shows a cross-sectional side view of a portion of a metal oxide semiconductor field effect transistor (MOSFET) device.
Figure 2:
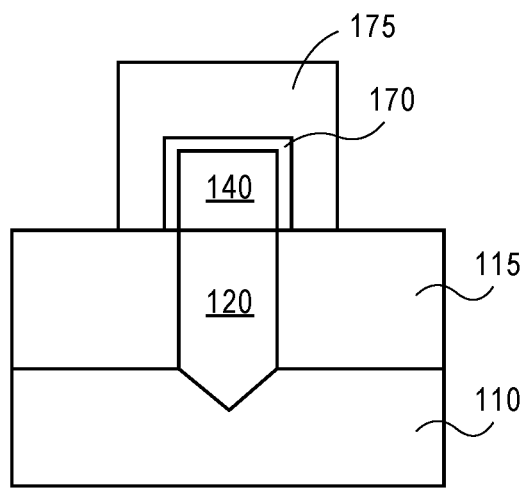
FIG. 2 shows the structure of FIG. 1 through line 2-2'.

FIG. 1 shows a cross-sectional side view of an embodiment of a field effect transistor (FET) device such as metal oxide semiconductor FET (MOSFET), either P-type or N-type. FIG. 2 shows the structure of FIG. 1 through line 2-2'. Referring to FIG. 1 and FIG. 2, device 100 includes substrate 110 that is, for example, a single crystal silicon substrate, representatively doped N-type or P-type. Disposed on substrate 110, in this embodiment, is intrinsic layer 140. Intrinsic layer 140, in one embodiment, is selected of a material desired for a channel of the transistor device as the intrinsic layer will include the channel of the device. In one embodiment, the channel is undoped (electrically neutral) or doped with less than 5E17 carriers of either type. Formed on opposite sides of intrinsic layer 140 is diffusion or junction region or source 150 and diffusion or junction region or drain 155. In one embodiment, source 150 and drain 155 are of an opposite conductivity type than that of the channel of intrinsic layer 140.

Overlying the channel of intrinsic layer 140 is a gate stack including a gate dielectric and a gate electrode. FIG. 1 shows gate dielectric layer 170 disposed on a surface of intrinsic layer 140 (a top surface as viewed). Gate dielectric material 170 is, for example, a silicon dioxide or a dielectric material having a dielectric constant greater than silicon dioxide (a high-k material) or a combination of silicon dioxide and a high-k material or multiple high-k materials. Disposed on gate dielectric layer 170 is gate electrode 175. In one embodiment, gate electrode 175 is a metal or metal compound or alloy or a silicide. Examples of material for gate electrode 175 include tungsten, titanium, tantalum or a nitride of tungsten, titanium or tantalum.

Disposed between substrate 110 and intrinsic layer 140 is retrograde layer 120. Retrograde layer 120, in one embodiment, includes a material or materials that will accept a well implant or dopant that, in one aspect, will reduce an off-state leakage in a transistor formed above it. Examples of well implants include boron, phosphorous, indium and arsenic. In one embodiment, a well implant has the same conductivity as the channel and is introduced after the introduction (e.g., epitaxial growth) of intrinsic layer on retrograde layer 120. In one embodiment, retrograde layer 120 has a greater solubility for the well implant than intrinsic layer 140. In one embodiment, a segregation coefficient for the well implant of a material for retrograde layer 120 to intrinsic layer 140 is greater than one. The well implant atoms therefore prefer to reside in retrograde layer relative to intrinsic layer. The relative properties of a material for retrograde layer 120 and a material for intrinsic layer 140 therefore allow a segregation of a well implant, after the introduction of the well implant into the intrinsic layer on substrate 110, to cross the hetero-material interface to create a high concentration of the well implant in retrograde layer 120 relative to a concentration of the well implant in intrinsic layer 140 (e.g., a highly retrograde profile).

Examples of materials for retrograde layer 120 and intrinsic layer 140 for a particular dopant are set forth in Table 1.

TABLE 1

| Retrograde Material | Intrinsic Material | Well Implant | Transistor Type |
|---|---|---|---|
| Silicon | Germanium (or SiGe) | Phosphorous | P-type |
| Germanium (or SiGe) | Silicon | Boron | N-type |
| GaAlAs | GaAs | Be or Zn | N-type |
| InP | InGaAs | Be or Zn | N-type |

The embodiment of a transistor device shown in FIG. 1 and FIG. 2 is that of a non-planar device such as a non-planar, multi-gate transistor device. In this embodiment, best illustrated in FIG. 2, retrograde layer 120 and intrinsic layer 140 are formed on (above as viewed) substrate 110 with at least intrinsic layer 140 extending above dielectric layer 115 and representing a transistor body or fin with a thickness of the fin measured between source and drain determining a channel length of the device. The gate stack (gate dielectric layer 170 and gate electrode 175) wraps around intrinsic layer 140 along the channel length. While a non-planar device is illustrated, it is illustrated as an example. The disclosure presented herein applies to non-planar devices as well as other transistor device structures such as planar devices and gate all around or nanowire devices.

FIG. 3 presents a process flow for forming a retrograde layer and an intrinsic layer on a substrate and doping the layers with a well dopant. The process flow begins with substrate 210 that is a semiconductor substrate such as a silicon wafer or a silicon on insulator that may be doped to be of a desired conductivity (P-type or N-type). Onto a surface of substrate 210 is introduced by, for example, epitaxial growth or deposition, retrograde layer 220 of one or more materials followed by intrinsic layer 240. Intrinsic layer 240 may be doped to be of a desired conductivity (P-type or N-type) for a channel region of a transistor device to be defined therein. The process then implants well implant 225 of, for example, a similar conductivity type as that of intrinsic layer 240, into the layers. A representative implant for a P-type well implant is boron and representative implant for an N-type well implant is phosphorous. A representative energy level for well implant 225 is on the order of 100 kiloelectron-volts (KeV) to 600 KeV. A representative implant dose is 1E12 $cm^{-2}$ to 1E14 $cm^{-2}$. In this embodiment, a material of retrograde layer 220 has a greater solubility for the implant than a material of intrinsic layer 240. FIG. 4 shows a graph of a concentration of well implant 225 in the various layers (substrate 210, retrograde layer 220 and intrinsic layer 240) following the implantation. FIG. 4 shows the well implant has an initial concentration profile that favors well implant migration to retrograde layer 220 with enough concentration of well implant 225 in intrinsic layer 240 so that the profile resembles a bell curve. Following implantation of well implant 225, the structure is subject to a thermal anneal. A representative thermal anneal is on the order of greater than 800° C. FIG. 5 shows the concentration profile of well implant in the layers following the anneal. As illustrated, the greater solubility of well implant 225 in a material for retrograde layer 220 relative to intrinsic layer 240 causes well implant 225 to migrate in response to the anneal from intrinsic layer 240 and segregate in retrograde layer 220. The result is a highly retrograde well implant profile as illustrated in FIG. 5. In one embodiment, a concentration of the well implant in intrinsic layer 240 differs by an order of magnitude from the concentration of the well implant in retrograde layer 220 following the anneal (a concentration of well implant in intrinsic layer 240 is at least an order of magnitude less than a concentration in retrograde layer 220). One example would be a well implant concentration of less than 1E17 $cm^{-2}$ in intrinsic layer 240 to a concentration of 1E18 $cm^{-2}$ in retrograde layer 220.

Figure 8:
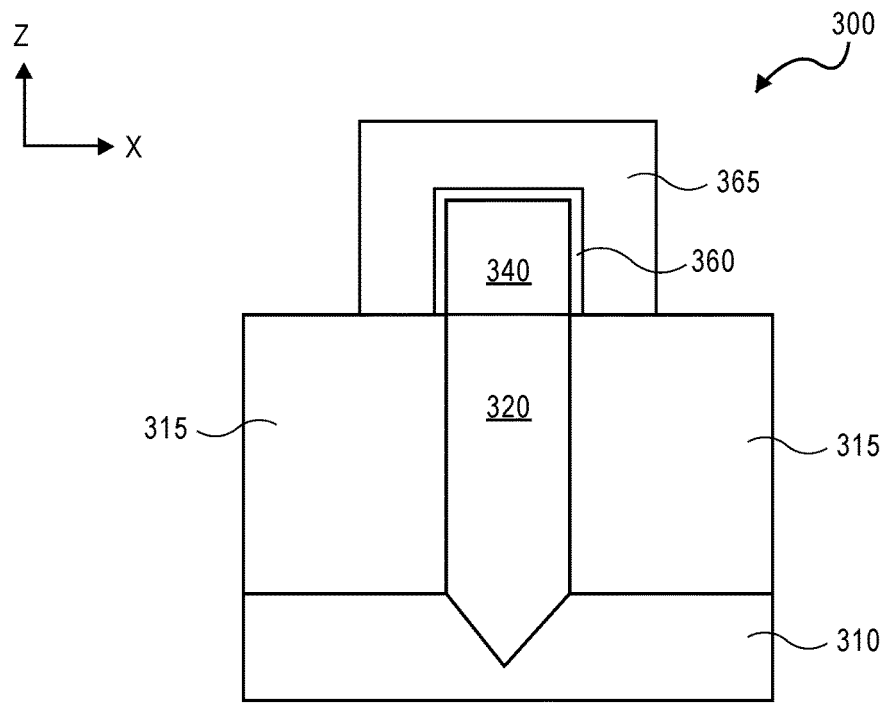
FIG. 8 shows the structure of FIG. 7 through line 8-8' following a removal of a dielectric layer to expose diffusion or junction regions and showing the gate stack of a gate dielectric and a dummy gate on the fin.
Figure 9:
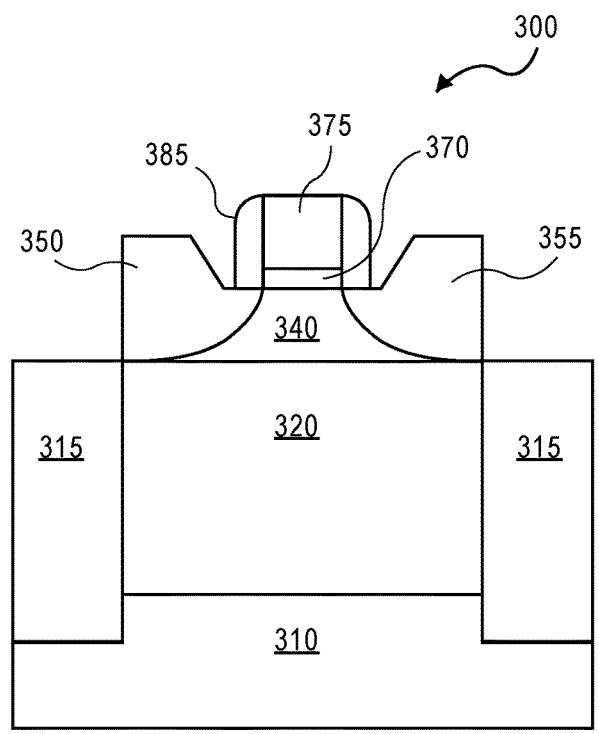
FIG. 9 shows a view of FIG. 6 through line 8-8' illustrating a formation of junction regions in the fin and a replacement of the dummy gate with a gate electrode.
Figure 10:
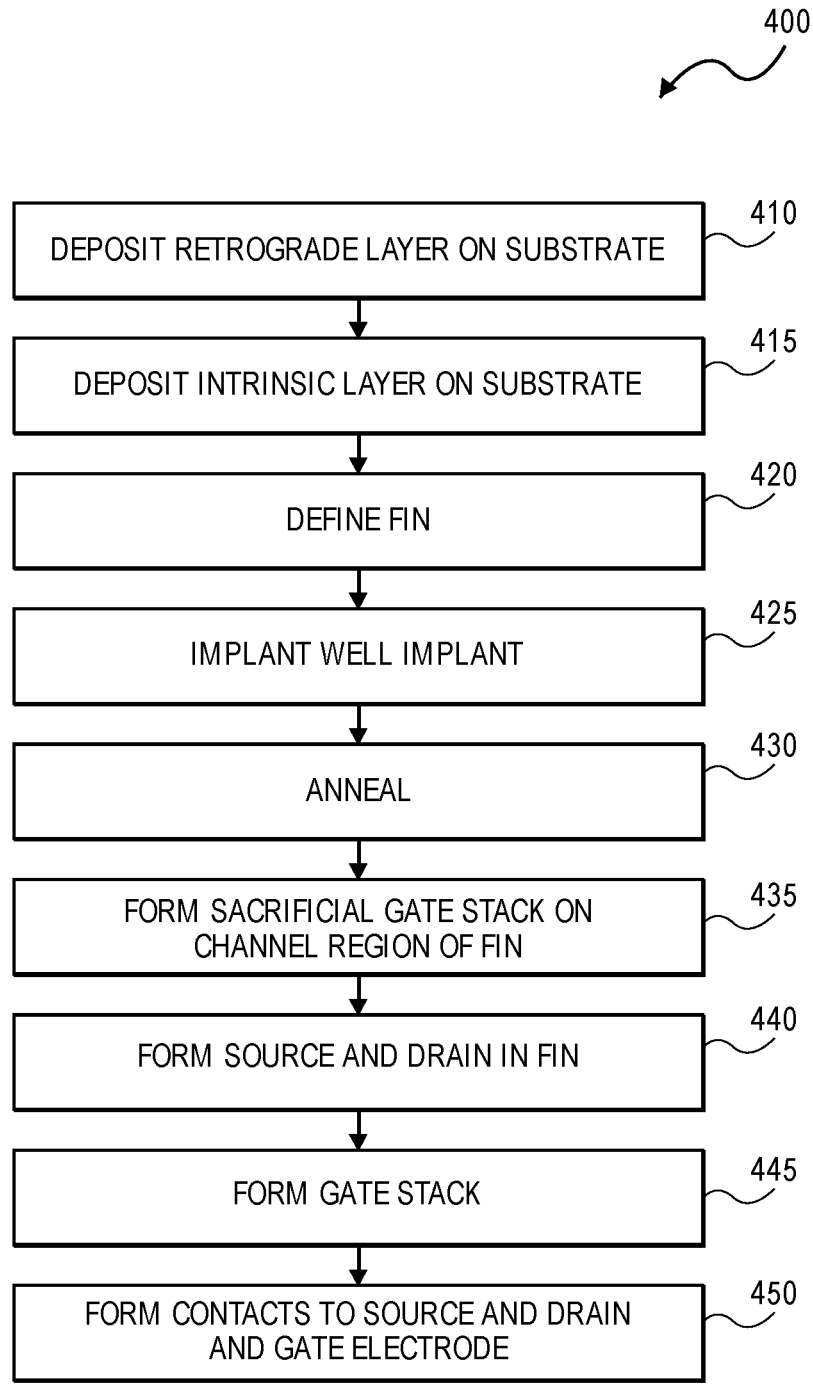
FIG. 10 presents a flow chart of forming the transistor device described with reference to FIGS. 6-9.

FIGS. 6-9 describe one process for forming an FET similar to that illustrated in FIG. 1 and FIG. 2. FIGS. 6-9 thus describe one embodiment of forming a three-dimensional non-planar FET including a retrograde layer beneath a channel of the device where a well implant has a greater solubility in a material of the retrograde layer than a material of the channel. FIG. 10 presents a flow chart of forming the transistor device described with reference to FIGS. 6-9. In this example process, a PMOS FET will be described.

Figure 6:
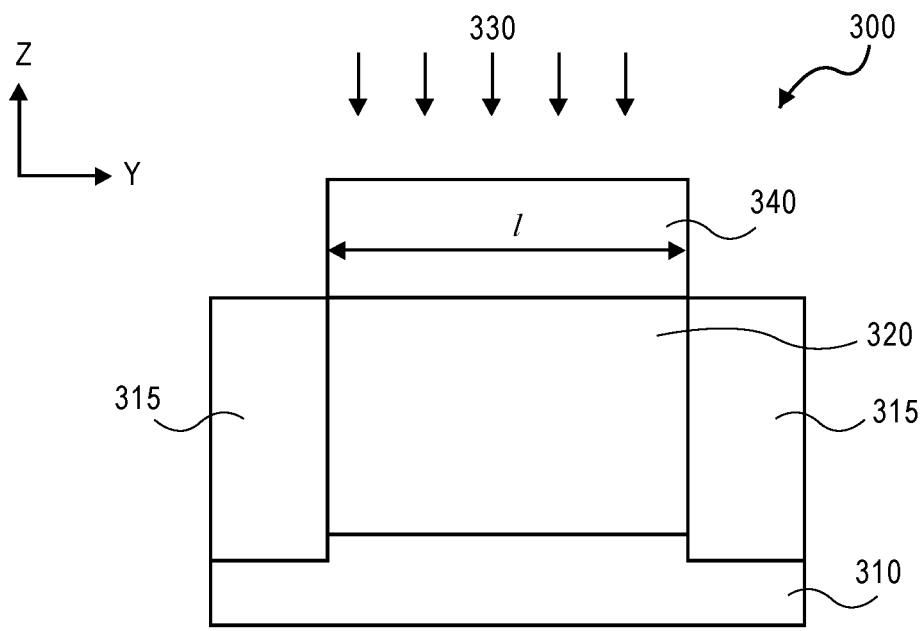
FIG. 6 shows a cross-sectional side view of a semiconductor substrate including a retrograde layer and an intrinsic layer formed as a body (e.g., a rectangular body) on the substrate and defining a fin of at least the intrinsic layer.

Referring to FIG. 6, the figure shows a cross-sectional side view of a semiconductor substrate. Substrate 310 includes any material that may serve as a foundation upon which a non-planar FET may be constructed. Representatively, substrate 310 is a portion of a larger substrate such as a wafer. In one embodiment, substrate 310 is a semiconductor material such as single crystal silicon. Substrate 310 may be a bulk substrate or, in another embodiment, is a silicon on insulator (SOI) structure.

In an embodiment involving non-lattice matched materials, bulk semiconductor substrates allow for implementation of high quality device layers. Disposed on a surface of substrate 310 in FIG. 6 is retrograde layer 320 (block 410, FIG. 10). In one embodiment, retrograde layer 320 is a material selected for its well implant solubility relative to a channel material to be subsequently formed thereon. One example for a PMOS FET is silicon that may be epitaxial grown on substrate 310. Alternatively, where substrate 310 is silicon and retrograde layer 320 is selected to be silicon, retrograde layer 320 may be defined in substrate 310 so that no deposit (growth) of retrograde material on substrate is necessary. In another embodiment, retrograde layer 320 includes a semiconductor material including a concentration of a semiconductor material such as germanium or a group III-V compound material. Where retrograde layer 320 has a different lattice constant than a material of substrate 310, a material of retrograde layer 320 may be compositionally graded through the layer. In an embodiment where retrograde layer 320 includes germanium (e.g., silicon germanium) and substrate 310 is silicon, a germanium concentration is increased from an interface of the layer with substrate 310 toward an apex of the layer as viewed. In this manner, a substrate lattice constant is effectively tuned from silicon at the interface to that of germanium at an apex of retrograde layer 320. In one embodiment, retrograde layer 320 including a graded concentration of germanium (e.g., silicon germanium buffer layer) may be epitaxially grown on substrate 310. In another embodiment, retrograde layer 320 may be made up of different semiconductor material layers. A first layer at an interface with substrate 310 may, for example, be a material that has a lattice constant similar to silicon and second layer selected for its well implant solubility. An example of a first layer is gallium phosphide (GaP) and an example of a second layer gallium phosphide arsenide ($Ga_xP_yAs_z$), in one embodiment, increasing in arsenide and decreasing in phosphide near an interface with intrinsic layer 340 where intrinsic layer 340 is gallium arsenide (GaAs). A similar configuration can be made with indium gallium arsenide ($In_xGa_yAs_z$) by adjusting the In/As ratio.

Overlying or disposed on retrograde layer 320 in structure 300 of FIG. 6 is intrinsic layer 340 (block 415, FIG. 10). A representative material for intrinsic layer 340 is a material that is desired for a channel of a transistor device and the solubility of a well implant in the material will be less than in a material of retrograde layer 320. One suitable material is germanium. In one embodiment, intrinsic layer 340 of germanium may be epitaxially grown.

After introduction of intrinsic layer 340 on retrograde layer 320, a semiconductor body or fin of at least intrinsic layer 340 is defined (block 420, FIG. 10). In one embodiment, such a fin may be defined by a mask and etch process where, for example, an area of a surface of intrinsic layer 340 having a desired channel width and device length, 1, including source and drain lengths is protected with a mask and the structure is then etched to substrate 310 to remove unprotected areas of intrinsic layer 340 and retrograde layer 320. The mask is then removed to leave a representatively generally rectangular body of intrinsic layer 340 and retrograde layer 320 disposed on (above as viewed) substrate 310. A rectangular shape may be targeted but it is appreciated that a shape of the body will depend at least in part on process tooling. Once a body of intrinsic layer 340 and retrograde layer 320 is defined, shallow trench isolation (STI) of a dielectric material such as silicon dioxide ($SiO_2$) may then be deposited to define a device area. A dielectric material is also deposited on the substrate to surround the body in a device area. FIG. 6 shows dielectric material 315 that is, for example, silicon dioxide ($SiO_2$) or a material having a dielectric constant less than $SiO_2$ (a low-k material). FIG. 6 shows structure 300 with intrinsic layer 340 exposed as a fin (not surrounded by dielectric material 315). In one embodiment, following a deposition of dielectric material 315 (e.g., a chemical vapor deposition (CVD)) to surround the body of intrinsic layer 340 and retrograde layer 320, a portion of dielectric material 315 may be removed to expose intrinsic layer 340 as a fin by a mask and etch process.

Once intrinsic layer 340 is formed on retrograde layer 320, a well implant can be introduced into structure 300. FIG. 6 shows well implant 330 introduced after defining a fin (block 425, FIG. 10). Well implant 330 for a PMOS FET is, for example, phosphorous. A representative energy level for introducing well implant 330 is 100 KeV to 600 KeV and a representative dose is on the order of 1E12 $cm^{-2}$ to 1E14 $cm^{-2}$. Following the introduction of well implant 330 into the fin, structure 300 may be annealed to drive the implant into the layers and create a highly retrograde profile such as shown in FIG. 5 (block 430, FIG. 10). A representative anneal temperature is greater than 800° C. Rather than perform the well anneal at this point in a transistor formation process, in another embodiment, the well anneal may be done later such as at the time of a separate high annealing process associated with structure 300.

Figure 7:
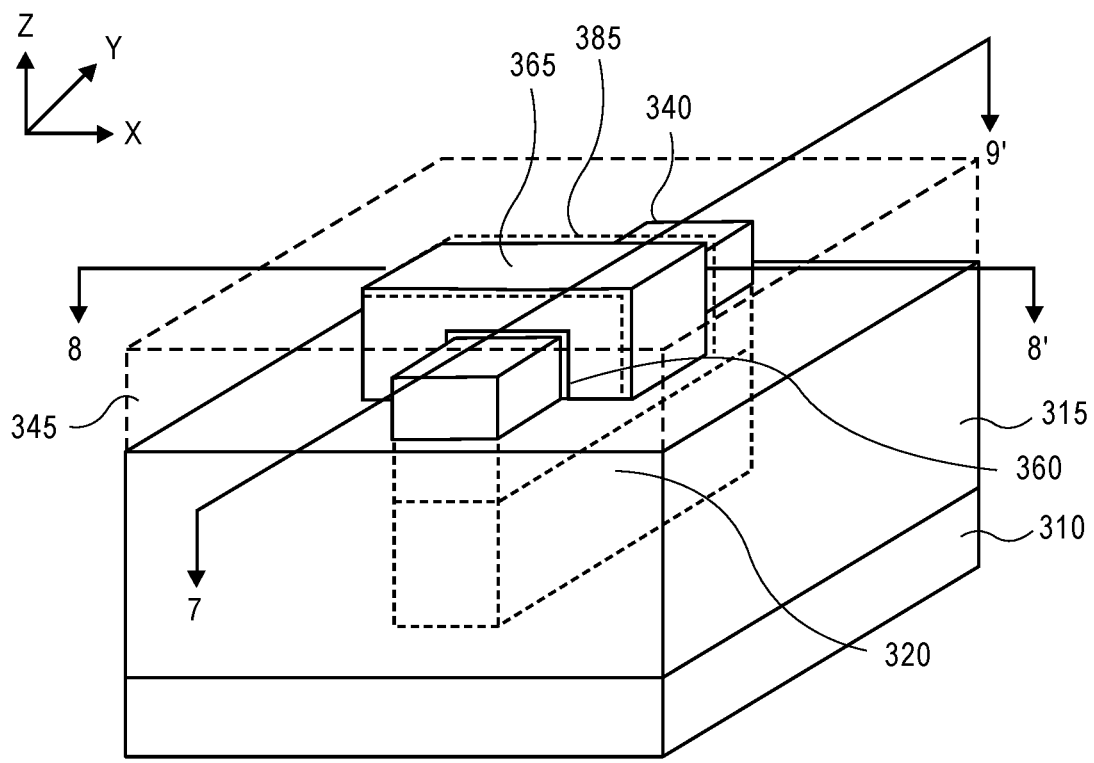
FIG. 7 shows a top side perspective view of the structure of FIG. 6 following the formation of a sacrificial gate stack on the fin.

FIG. 7 shows a top side perspective view of the structure of FIG. 6 following the formation of a sacrificial or dummy gate stack on fin portion of intrinsic layer 340 extending above dielectric material 315 (block 435, FIG. 10). In one embodiment, a gate stack includes gate dielectric layer 360 of, for example, $SiO_2$ or a high-k dielectric material. Disposed on gate dielectric layer 360, in one embodiment, is sacrificial or dummy gate 365 of, for example, polysilicon deposited by, for example, a chemical vapor deposition method. In one embodiment, to form the sacrificial gate stack, a mask material is introduced over the structure and patterned to have an opening for the gate stack. The gate stack is introduced. The gate stack may include spacer dielectric layer 385 on opposite sides thereof. Following formation of the sacrificial gate stack, the mask is removed and the structure is covered by a dielectric layer. FIG. 7 shows dielectric layer 345 of $SiO_2$ and a low-k dielectric adjacent the sidewalls of the sacrificial gate stack and on the fin portion of intrinsic layer 340.

FIG. 8 shows the structure of FIG. 7 through line 8-8' with dielectric layer 345 removed to show the sacrificial gate stack of gate dielectric 360 and dummy gate 365 on the fin defined by intrinsic layer 340. FIG. 9 shows a view of FIG. 7 through line 9-9' following a formation of junction regions in the fin and a replacement of the sacrificial gate stack with a gate stack. Representatively, to form junction regions 350 and 355, the junction regions are exposed in dielectric layer 345. Junction regions 350 and 355 may be formed by removing portions of the fin material and introducing source and drain material such as silicon germanium, pure germanium, and germanium tin to define a source ($p^+$ source) and drain ($p^+$ drain), respectively for a PMOS device (block 440, FIG. 10). Following formation of junction regions 350 and 355, the sacrificial gate stack is removed and replaced with a gate dielectric layer 370 of $SiO_2$ or a high-k material or a combination of $SiO_2$ and a high-k material and with gate electrode 375 such as a metal gate electrode (block 445, FIG. 10). Representative materials for a metal gate electrode include tungsten, tantalum, titanium or a nitride, a metal allow or another material. Following formation of gate electrode 370, contacts may be made to the junction regions and gate electrode 370 (block 450, FIG. 10).

Figure 11:
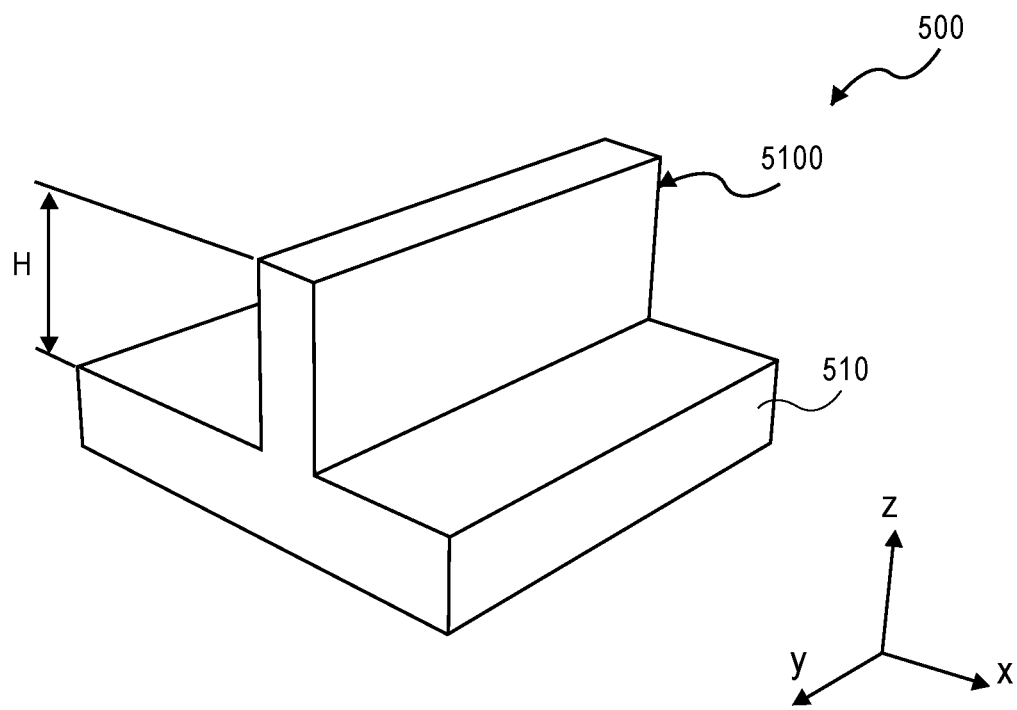
FIG. 11 shows a perspective side view of a substrate having a sacrificial fin formed therein according to a second embodiment of forming a transistor device.
Figure 17:
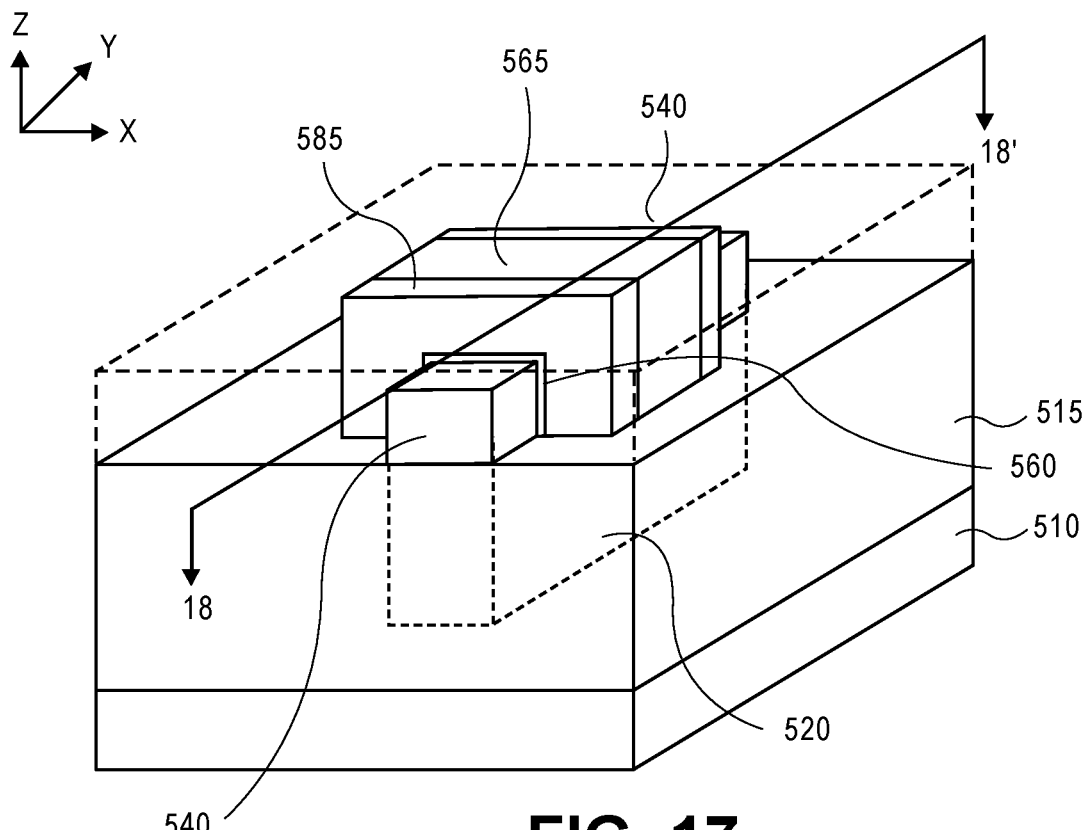
FIG. 17 shows a top side perspective view of the structure of FIG. 6 following the formation of a sacrificial or dummy gate stack on fin portion of an intrinsic layer extending above a dielectric layer.
Figure 18:
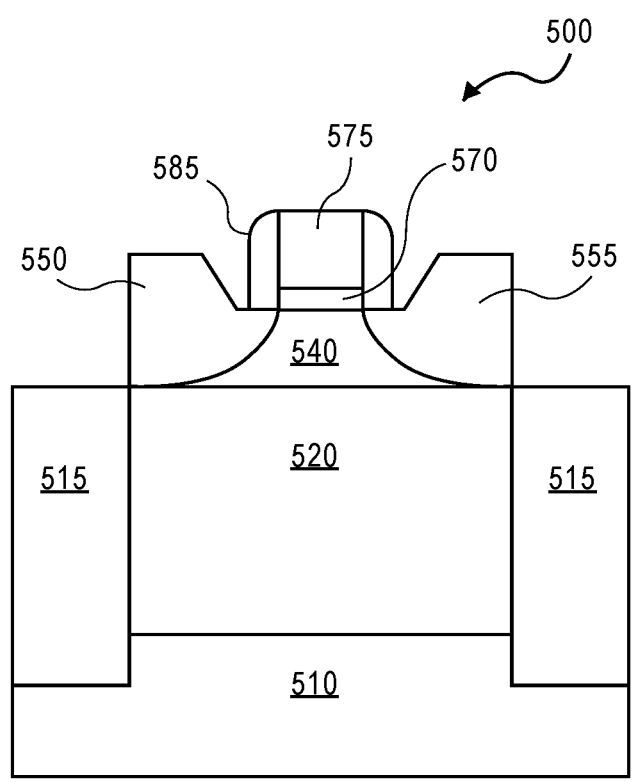
FIG. 18 shows the structure of FIG. 17 through line 18-18' after forming a source and a drain and replacement of the sacrificial gate stack with a gate electrode.
Figure 19:
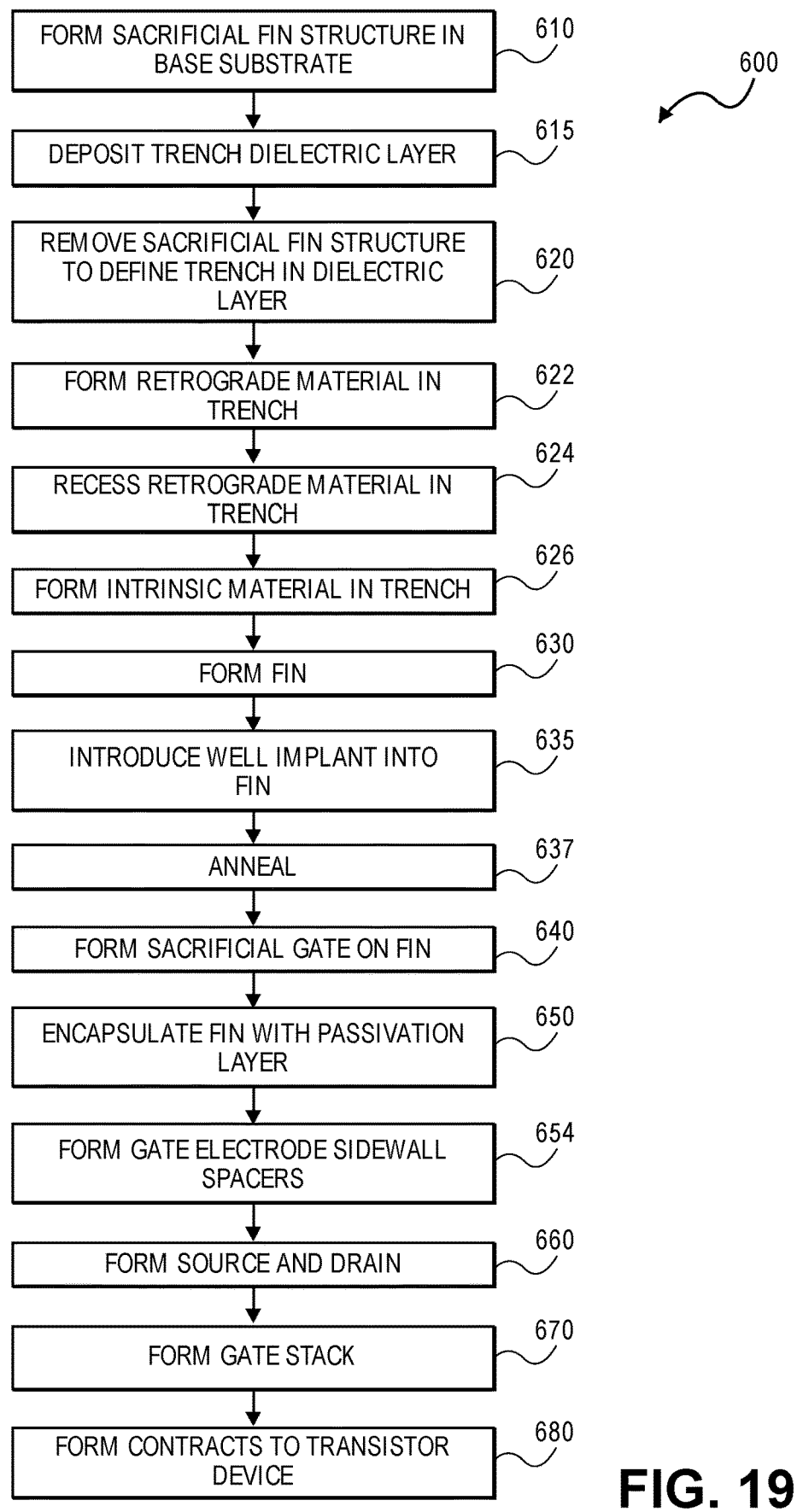
FIG. 19 presents a flow chart of a process of forming the transistor device illustrated in FIGS. 11-18.

FIGS. 11-20 describe another process for forming an FET such as illustrated in FIG. 1 and FIG. 2. FIG. 19 presents a flow chart of the process. Referring to FIG. 11 and with reference to the flow chart of FIG. 19, the process begins by defining sacrificial fin structures in a substrate material (block 610, FIG. 19). FIG. 11 shows a perspective side view of structure 500 of substrate 510 that may be any material that may serve as a foundation of which an FET may be constructed. Representatively, substrate 510 is a portion of a larger substrate such as wafer. In one embodiment, substrate 510 is a semiconductor material such as single crystal silicon. Substrate 510 may be a bulk substrate or, in another embodiment, a semiconductor on insulator (SOI) structure. FIG. 11 shows substrate 510 following a patterning of the substrate to define sacrificial fin 5100. Sacrificial fin 5100 may be one of many sacrificial fins formed in the substrate. Sacrificial fin 5100 may be formed by a mask and etch process wherein a mask (e.g., a hard mask) is introduced on a surface (superior surface) of substrate 510 to protect areas of the substrate where the sacrificial fins will be defined and to provide openings in non-fin areas. Once the mask is patterned, substrate 510 may be etched to remove material in unprotected areas. A substrate of silicon may be etched with a wet or dry etch. Representatively, a suitable etchant is chlorine or fluorine plasma based etch chemistry. In one embodiment, sacrificial fin 5100 is formed to have a height, H, on the order of 100 nanometers (nm) to 400 nm. After fin 5100 is formed, the mask is removed to provide structure 500 shown in FIG. 11.

Figure 12:
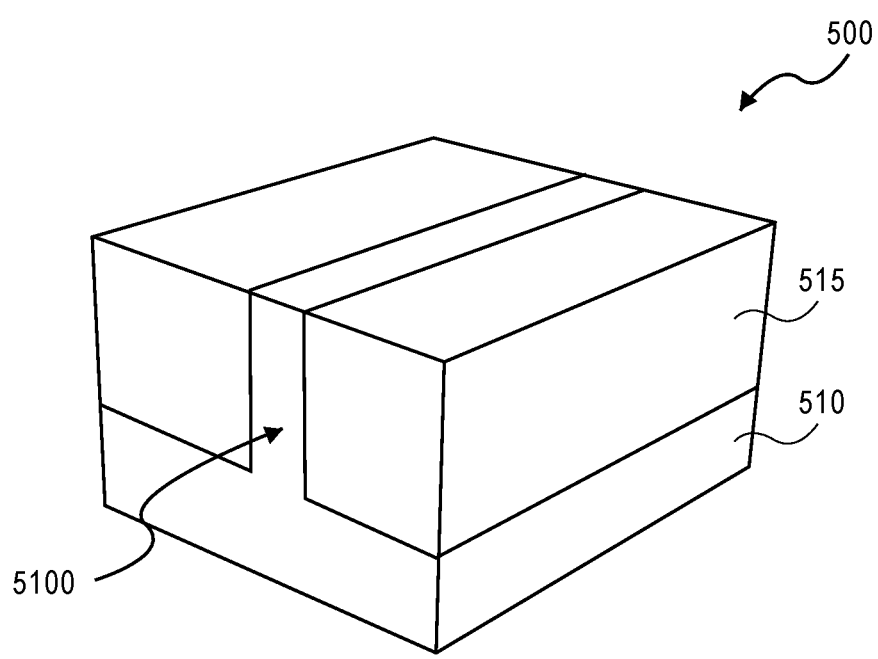
FIG. 12 shows the structure of FIG. 11 having a trench dielectric layer on the substrate surrounding the sacrificial fin.

FIG. 12 shows structure 500 of FIG. 11 following a removal of the mask on the fin and following the deposition of a trench dielectric layer on the substrate (block 615, FIG. 19). In one embodiment, dielectric layer 515 is silicon dioxide or a low-k dielectric material. Following deposition of dielectric layer 515, a surface of the structure (a superior surface as viewed) is polished to the level of the top of sacrificial fin 5100 so that the fin is exposed as shown in FIG. 12.

Figure 13:
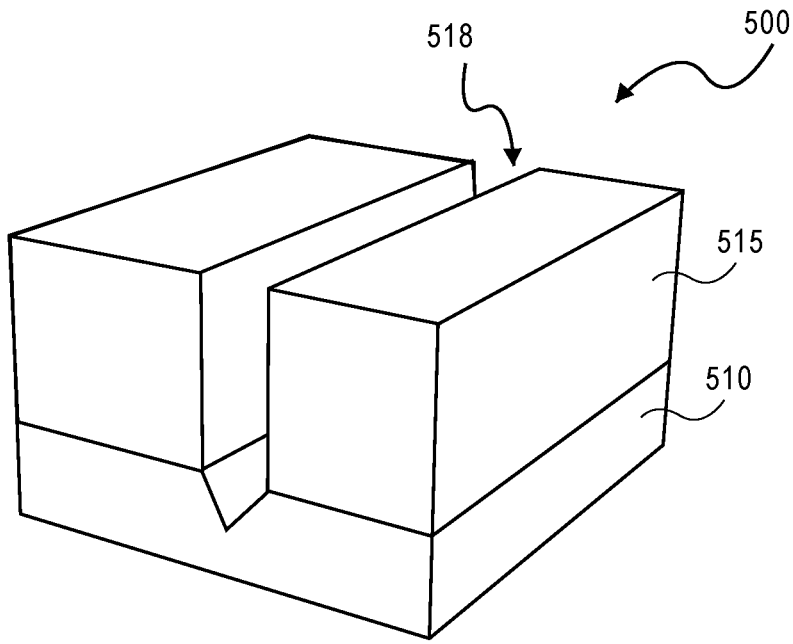
FIG. 13 shows the structure of FIG. 12 following the removal of the sacrificial fin to form a trench of a controlled size and shape.

FIG. 13 shows structure 500 of FIG. 12 following the removal of sacrificial fin 2100 to form a trench of a controlled size and shape (block 620, FIG. 19). The sacrificial fin may be removed by a mask and etch process wherein a mask is patterned on a surface of dielectric layer 515 leaving sacrificial fin 5100 exposed followed by an etch process to remove the fin. Sacrificial fins of a silicon material may be etched by a dry or wet etch or a combination of the two. Suitable etchants for etching sacrificial fins of a silicon material include potassium hydroxide (KOH) and tetramethylammonium hydroxide (TMAH). The removal of the sacrificial fin forms trench 518. In one embodiment, the etching of the sacrificial fin may be performed to provide a {111} faceting at the bottom of trench 518 to facilitate a growth of a material in the trench which is done using TMAH-like or any equivalent chemistry. Alternative geometries are also contemplated.

Figure 14:
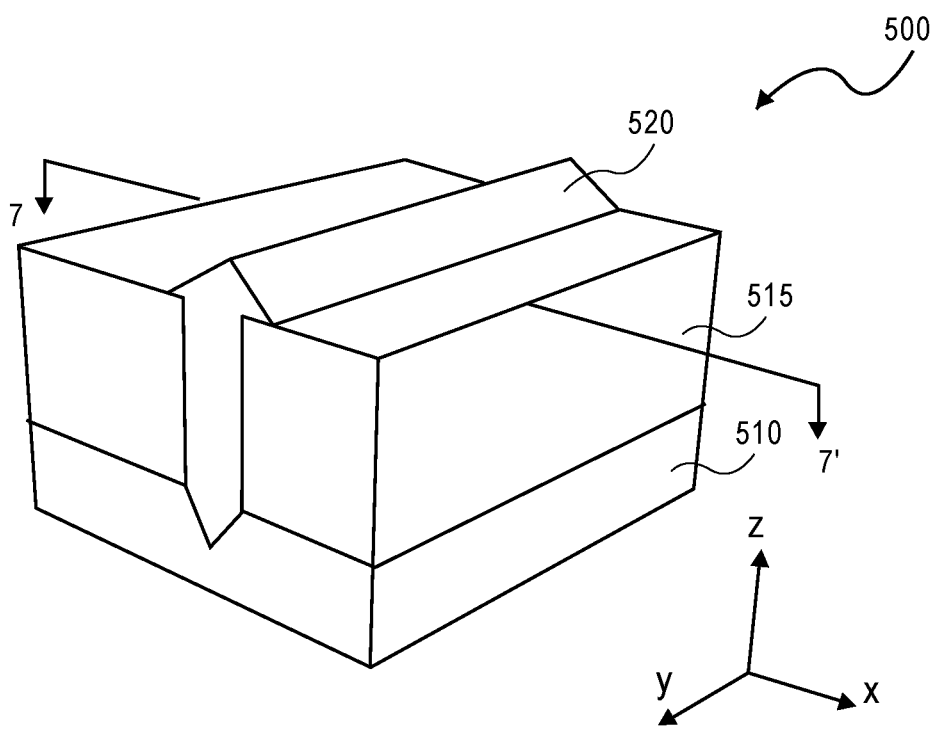
FIG. 14 shows the structure of FIG. 13 following the introduction of a buffer material in the trench.

FIG. 14 shows structure 500 of FIG. 13 following the introduction of a retrograde material in trench 518 (block 622, FIG. 19). In one embodiment, retrograde material 520 is a material selected for its well implant solubility relative to a channel material to be subsequently formed thereon. Where a channel material is to germanium and the well dopant is to be phosphorous, one suitable material for retrograde material is silicon. The retrograde material may be introduced by an epitaxial growth process. In another embodiment, the trenches may be filled with a first retrograde material of one of the noted materials as, for example, a nucleation layer at a base of trench 518 followed by a second retrograde material of another of the noted materials. The trench confined growth of a retrograde material or materials offer an advantage of aspect ratio trapping (ART) whereby crystalline quality of the epitaxial layer(s) is enhanced through trapping of threading dislocations, stacking faults, twins, etc., at sidewalls of a trench where defects terminate such that overlying layers may be increasingly defect-free. FIG. 14 shows retrograde material 520 in trench 518. The retrograde material has a dimension measured in a z-direction on the order of 100 nm to 400 nm. FIG. 14 representatively shows retrograde material 520 including {111} faceted overgrowth protruding off the superior plane defined by dielectric layer 515.

Figure 15:
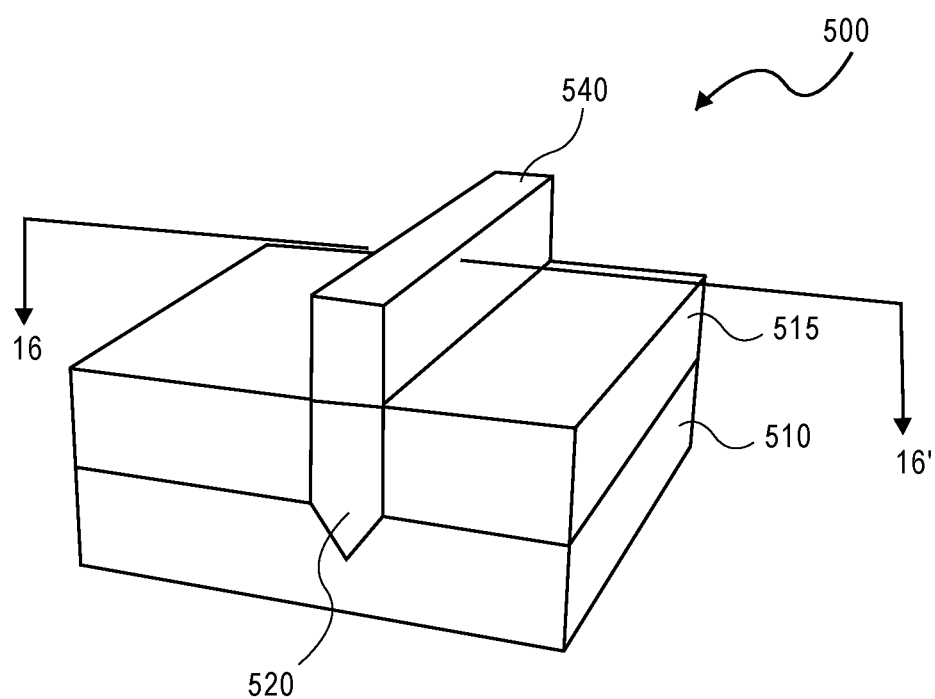
FIG. 15 shows the structure of FIG. 14 following a removal of a portion of the buffer material in the trench, the introduction of an intrinsic material into the trench and the recession of the dielectric layer to define a fin.

FIG. 15 shows structure 500 of FIG. 14 following a removal of a portion of retrograde material 520 in trench 518 and the introduction of an intrinsic material into the trench and the subsequent recession of dielectric layer 515. In one embodiment, the removal of retrograde material 520 is performed by an etch to recess the retrograde material in the trench (block 624, FIG. 19). A suitable etchant for retrograde material 520 of silicon is TMAH-like or any equivalent chemistry. FIG. 15 shows intrinsic layer 540 formed on retrograde material 520 (block 626, FIG. 19). The intrinsic layer may be epitaxially grown in trench 518. In one embodiment, intrinsic layer 540 is a germanium. Intrinsic layer 540 has a representative height on the order of 40 nm to 100 nm. FIG. 15 shows the structure following a polish of the intrinsic layer to a plane defined by dielectric layer 515 and after a recession of dielectric layer 515 such that intrinsic layer 540 is protruding above a plane defined by dielectric layer 515 as a fin structure (block 630, FIG. 19).

Figure 16:
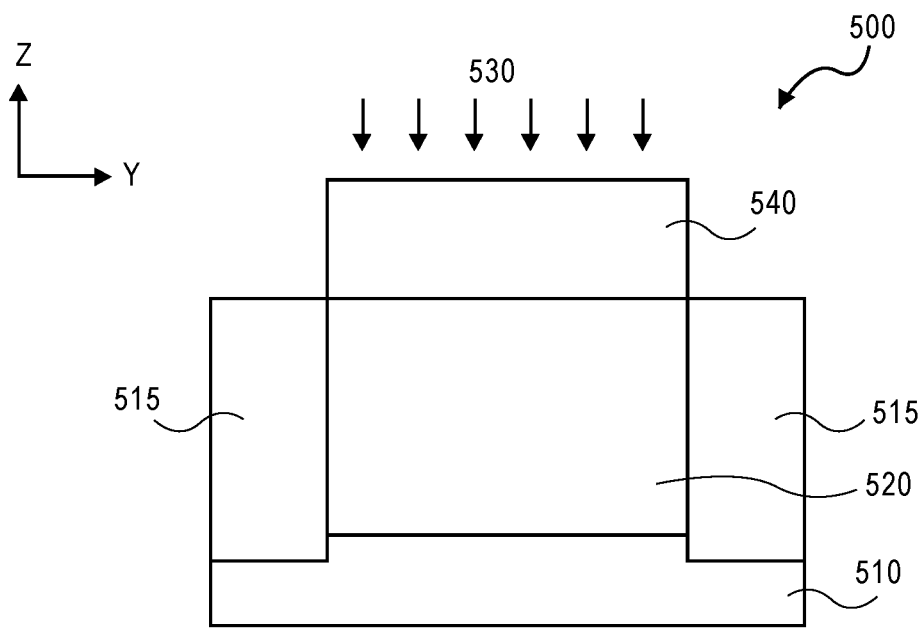
FIG. 16 shows a cross-sectional side view of the structure of FIG. 6 through line 7-7' and the implantation of a well implant into the fin.

FIG. 16 shows a cross-sectional side view of the structure of FIG. 15 through line 16-16'. A representative height of the exposed fin is representatively on the order of 500 angstroms (Å). FIG. 16 shows an introduction of a well implant into the fin (block 635, FIG. 19). For a PMOS device, a representative well implant 530 is phosphorous implanted with an implantation energy and dosage of 100 to 600 KeV and 1E12 $cm^{-2}$ to 1E14 $cm^{-2}$. Following the well implant introduction, structure 500 may be annealed at a temperature to drive the well implant into the structure (block 637, FIG. 19). In another embodiment, an anneal may be performed later in the transistor formation process, for example, in connection with an anneal for a different purpose.

FIG. 17 shows a top side perspective view of structure 500 of FIG. 15 following the formation of a sacrificial or dummy gate stack on the fin portion of intrinsic layer 540 extending above dielectric layer 515 (block 640, FIG. 19). In one embodiment, a gate stack includes gate dielectric layer 560 of, for example, silicon dioxide or a high-k dielectric material. Disposed on gate dielectric layer 560, in one embodiment, is sacrificial or dummy gate 565 of, for example, polysilicon deposited by, for example, a chemical vapor deposition method. In one embodiment, prior to forming the gate stack, a dielectric layer of silicon dioxide or a low k material is introduced on the structure include an intrinsic layer 540. The dielectric layer is shown in dashed lines. To form the gate stack, a mask material is introduced over the structure on the dielectric layer and patterned to have an opening through the dielectric layer in an area for the gate stack. The gate stack is then introduced in the opening.

FIG. 18 shows structure 500 of FIG. 17 through line 18-18' after forming diffusion or junctions and replacement of the sacrificial gate stack on the fin defined by intrinsic layer 540 with a gate stack. In one embodiment, source 550 and drain 555 are formed by initially removing portions of intrinsic layer 540 in corresponding to diffusion regions (source and drain regions) in the fin. Representatively, an etch under cut (EUC) is performed to remove portions of intrinsic layer 540 in areas corresponding to a source region and a drain region with dummy gate 565 and sidewall spacers 585 protecting intrinsic layer 540 in a channel region. Following a removal of portions of intrinsic layer 540 in source and drain regions to leave voids, source 550 and drain 555 are formed in respective voids (block 660, FIG. 19). In one embodiment where intrinsic layer 540 is germanium, source 550 and drain 555 are a highly doped germanium (p++) such as a boron-doped germanium that is epitaxially grown.

FIG. 18 also shows structure 500 of FIG. 17 following the replacement of the sacrificial gate stack. Following formation of source 550 and drain 555, a dielectric material is introduced on the structure (on a surface including source 550, drain 555 and dummy gate 565). In one embodiment, dielectric material 590 (an ILD0) is silicon dioxide or a low k material or a combination of materials (e.g., multiple low k materials or silicon dioxide and one or more low k materials). Sacrificial gate 565 and gate dielectric 560 are then removed by, for example, masking dielectric material 590 with an opening to expose the gate stack and then an etch process to remove dummy gate 565 and gate dielectric 560. The gate stack is replaced initially with gate dielectric 570 of, for example, silicon dioxide, a high-k material or a combination of silicon dioxide and a high-k material. This is followed by the formation of gate electrode 575 such as a metal gate electrode in a gate-last process flow (block 670, FIG. 19). Representative materials for gate electrode 575 include, but are not limited to, tungsten, tantalum, titanium or a nitride, a metal alloy or another material. Following formation of gate electrode 575, contacts may be made to source 250 and drain 255 (and gate electrode 575) (block 680, FIG. 19).

Figure 20:
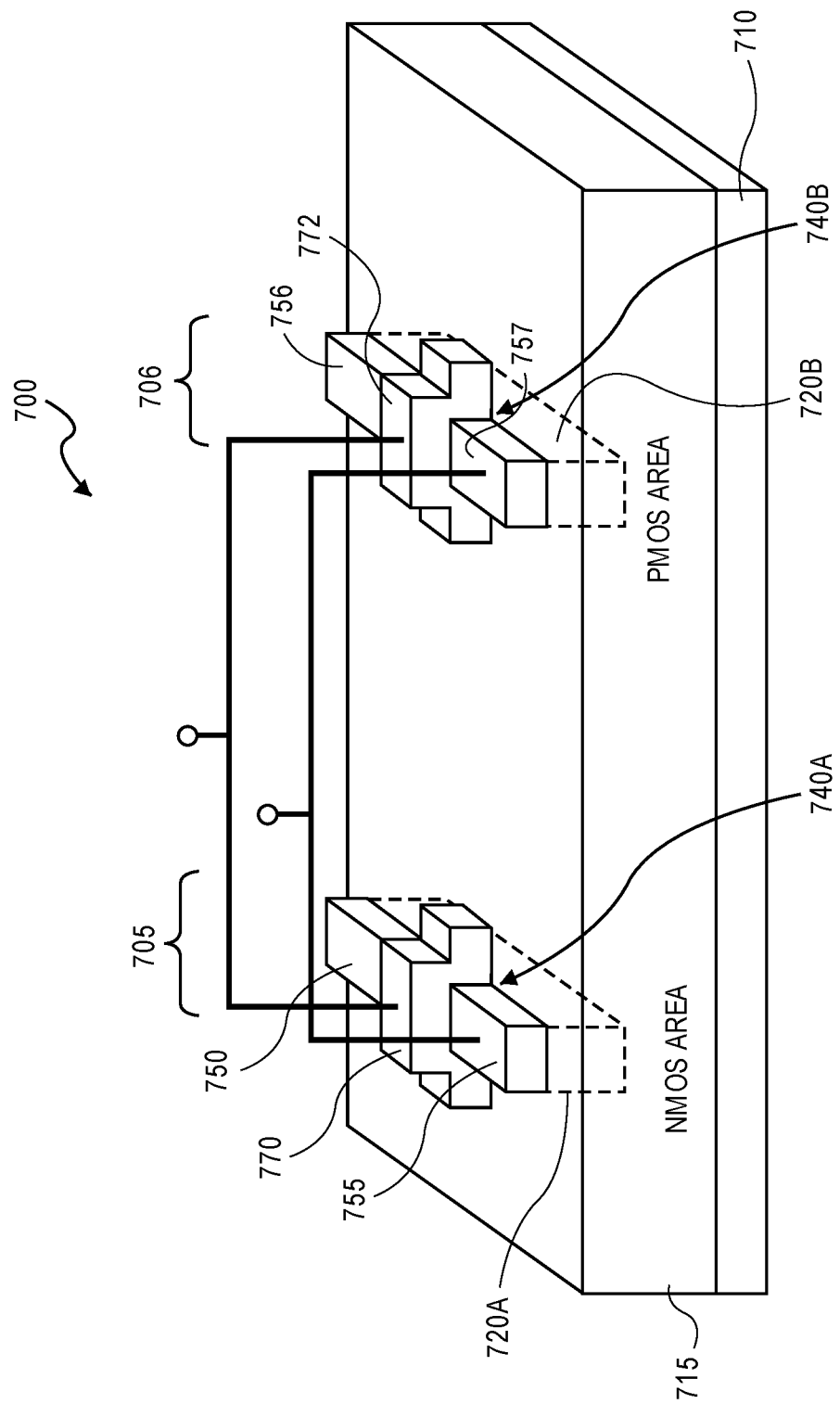
FIG. 20 shows a top side perspective view of an embodiment of a CMOS inverter.

FIG. 20 shows a top, side perspective view of a CMOS inverter. Inverter 700 includes, in this embodiment, N-channel MOSFET 705 and P-channel MOSFET 706. Each of N-channel MOSFET 705 and P-channel MOSFET 706 is, in this embodiment, a non-planar device. It is appreciated that an inverter could also be formed using non-planar (e.g., multigate, nanowire) devices or a combination of different device types. In the embodiment illustrated in FIG. 20, each of N-channel MOSFET 705 and P-channel MOSFET 706 is formed on substrate 710. Substrate 710 is, for example, a single crystal silicon bulk substrate or a silicon on insulator (SOI) substrate. N-channel MOSFET 705 and P-channel MOSFET 706 are separated by isolation 725 of, for example, a dielectric material such as an oxide denoting in this illustration an NMOS area and a PMOS area. The MOSFET devices each include a retrograde layer beneath a channel of the device with a highly retrograde well and formed by methods such as described above with reference to FIGS. 3-10 or FIGS. 11-19. In NMOS area, overlying silicon substrate 710 is retrograde layer 720A of, for example, a material or materials such as described above that is/are selected for its/their solubility relative to a channel material of N-channel MOSFET 705. An example material for retrograde material 720A is SiGe. Overlying retrograde layer 720A in an NMOS area of the substrate is intrinsic layer 740A of, for example, silicon. Retrograde layer 720A and intrinsic layer 740A are formed into a body with at least intrinsic layer 740A protruding above dielectric layer 715 as a fin. A well dopant of, for example, boron, may be introduced such as described above into the fin and annealed to form a highly retrograde profile similar to that illustrated in FIG. 5. N-channel MOSFET 705 includes gate electrode 775 and appropriately doped source 750 and drain 755. Gate electrode 775 is disposed on a channel region of the transistor that is formed in intrinsic layer 740A. Gate electrode 775 is separated from the channel region by a gate dielectric disposed therebetween of, for example, silicon dioxide or a high-k dielectric material or a combination of the two.

P-channel MOSFET 706 in one embodiment is formed separately than N-channel MOSFET 705. P-channel MOSFET 706 includes gate electrode 772 and source 756 and drain 757 appropriately doped or constituting P-type material. In one embodiment, source 756 and drain 757 are a germanium material. Gate electrode 772 is disposed on a gate dielectric on a channel region of the transistor that is formed in intrinsic layer 740B. A material for intrinsic layer 740B is disposed on a retrograde layer 720B. A segregation coefficient of a well implant for retrograde layer 720B to intrinsic layer 740B is greater than one with the well implant favoring segregation to retrograde layer 720B.

One way to form the NMOS device and the PMOS device of the CMOS inverter is to perform certain formation processes in one device area while the other device area is protected. For example, in an embodiment where retrograde layer 720B in PMOS area is to be silicon, a device area for NMOS device may be protected (e.g., masked) while retrograde layer 720B is introduced (e.g., deposited). Alternatively, a retrograde layer for a PMOS device may be introduced in both PMOS and NMOS device areas and subsequently removed in the NMOS device area and replaced with a desired material for retrograde layer 720A.

Other formation processes to form an individual transistor device in a device may be performed by protecting the other device area.

CMOS inverter 700 is formed by the connection of drain 755 of N-channel MOSFET 705 to drain 757 of P-channel MOSFET 706 and the connection of each gate electrode as illustrated.

Figure 21:
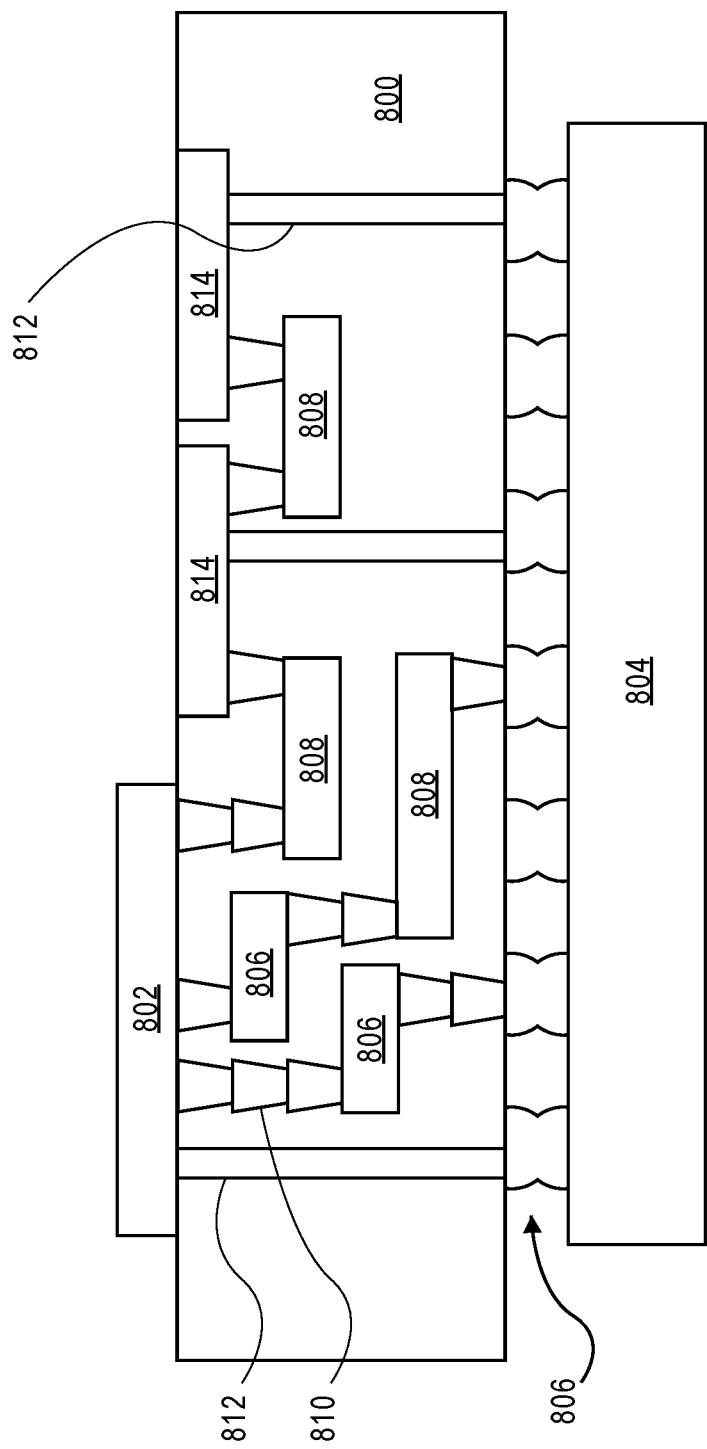
FIG. 21 is an interposer implementing one or more embodiments.

FIG. 21 illustrates interposer 800 that includes one or more embodiments. Interposer 800 is an intervening substrate used to bridge a first substrate 802 to second substrate 804. First substrate 802 may be, for instance, an integrated circuit die. Second substrate 804 may be, for instance, a memory module, a computer motherboard, or another integrated circuit die. Generally, the purpose of interposer 800 is to spread a connection to a wider pitch or to reroute a connection to a different connection. For example, an interposer 800 may couple an integrated circuit die to a ball grid array (BGA) 806 that can subsequently be coupled to the second substrate 804. In some embodiments, the first and second substrates 802/804 are attached to opposing sides of interposer 800. In other embodiments, the first and second substrates 802/804 are attached to the same side of interposer 800. In further embodiments, three or more substrates are interconnected by way of interposer 800.

The interposer 800 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 808 and vias 810, including but not limited to through-silicon vias (TSVs) 812. The interposer 800 may further include embedded devices 814, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on interposer 800.

In accordance with embodiments, apparatuses or processes disclosed herein may be used in the fabrication of interposer 800.

Figure 22:
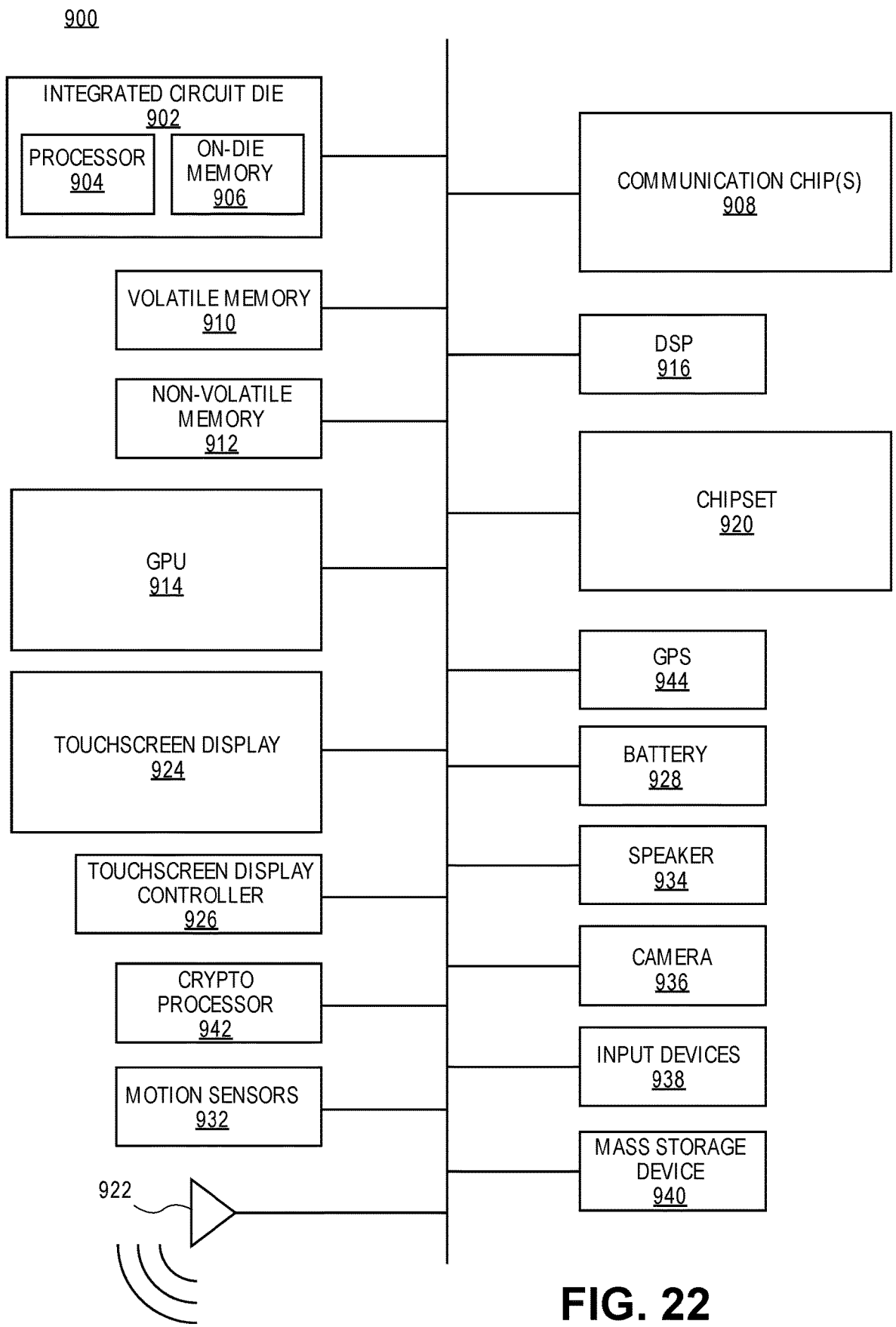
FIG. 22 illustrates an embodiment of a computing device.

FIG. 22 illustrates a computing device 900 in accordance with one embodiment. The computing device 900 may include a number of components. In one embodiment, these components are attached to one or more motherboards. In an alternate embodiment, these components are fabricated onto a single system-on-a-chip (SoC) die rather than a motherboard. The components in the computing device 900 include, but are not limited to, an integrated circuit die 902 and at least one communication chip 908. In some implementations the communication chip 908 is fabricated as part of the integrated circuit die 902. The integrated circuit die 902 may include a CPU 904 as well as on-die memory 906, often used as cache memory, that can be provided by technologies such as embedded DRAM (eDRAM) or spin-transfer torque memory (STTM or STTM-RAM).

Computing device 900 may include other components that may or may not be physically and electrically coupled to the motherboard or fabricated within an SoC die. These other components include, but are not limited to, volatile memory 910 (e.g., DRAM), non-volatile memory 912 (e.g., ROM or flash memory), a graphics processing unit 914 (GPU), a digital signal processor 916, a crypto processor 942 (a specialized processor that executes cryptographic algorithms within hardware), a chipset 920, an antenna 922, a display or a touchscreen display 924, a touchscreen controller 926, a battery 928 or other power source, a power amplifier (not shown), a global positioning system (GPS) device 944, a compass 930, a motion coprocessor or sensors 932 (that may include an accelerometer, a gyroscope, and a compass), a speaker 934, a camera 936, user input devices 938 (such as a keyboard, mouse, stylus, and touchpad), and a mass storage device 940 (such as hard disk drive, compact disk (CD), digital versatile disk (DVD), and so forth).

The communications chip 908 enables wireless communications for the transfer of data to and from the computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 908 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 900 may include a plurality of communication chips 908. For instance, a first communication chip 908 may be dedicated to shorter range wireless communications such as Wi-Fi and Bluetooth and a second communication chip 908 may be dedicated to longer range wireless communications such as GPS, EDGE, GPRS, CDMA, WiMAX, LTE, Ev-DO, and others.

The processor 904 of the computing device 900 includes one or more devices, such as transistors, that are formed in accordance with embodiments described above. The term "processor" may refer to any device or portion of a device that processes electronic data from registers and/or memory to transform that electronic data into other electronic data that may be stored in registers and/or memory.

The communication chip 908 may also include one or more devices, such as transistors, that are formed in accordance with embodiments.

In further embodiments, another component housed within the computing device 900 may contain one or more devices, such as transistors, that are formed in accordance with implementations.

In various embodiments, the computing device 900 may be a laptop computer, a netbook computer, a notebook computer, an ultrabook computer, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 900 may be any other electronic device that processes data.

EXAMPLES

The following examples pertain to embodiments:

Example 1 is a transistor including a gate stack and a source and a drain on opposing sides of the gate stack; and a first material and a second material on the substrate, the first material disposed between the substrate and the second material and the channel of the transistor is defined in the second material between the source and the drain, wherein the first material and the second material each include an implant and the implant includes a greater solubility in the first material than in the second material.

In Example 2, a segregation coefficient of the first material to the second material for the implant of the transistor of Example 1 is greater than one.

In Example 3, at least one source and one drain of the transistor of Example 1 or 2 are formed in the second material.

In Example 4, the second material of the transistor of Example 1 includes a semiconductor body and the gate stack contacts at least two adjacent sides of the semiconductor body.

In Example 5, a complementary metal oxide semiconductor (CMOS) circuit including at least one P-type transistor device of any of Examples 1-4 and at least one N-type transistor device of any of Examples 1-4.

Example 6 is an integrated circuit structure including a first material layer and a second material layer on a substrate, wherein the first material layer is disposed between the second material layer and the substrate; and a transistor including a channel in the second material layer, the transistor including a gate stack and at least one source and one drain on opposing sides of the channel, wherein the first material layer includes an implant such that the first material layer inhibits an off-state leakage current of the transistor.

In Example 7, the implant of the integrated circuit structure of Example 6 includes a greater solubility in the first material layer than in the second material layer.

In Example 8, a segregation coefficient of the first material layer to the second material layer for the implant of the integrated circuit structure of Example 6 is greater than one.

In Example 9, the second material layer of the integrated circuit structure of any of Examples 6-8 includes a semiconductor body and the gate stack contacts at least two adjacent sides of the semiconductor body.

In Example 10, a complementary metal oxide semiconductor (CMOS) circuit including at least one P-type transistor device of any of Examples 6-9 and at least one N-type transistor device of any of Examples 6-9.

Example 11 is a method for forming an integrated circuit structure including forming a first material on a substrate; forming a second material on the first material; introducing an implant into the second material, wherein the implant includes a greater solubility in the first material than in the second material; annealing the substrate; and forming a transistor on the substrate, the transistor including a channel including the second material.

In Example 12, a segregation coefficient of the first material to the second material for the implant of the method of Example 11 is greater than one.

In Example 13, after annealing, a concentration of the implant in the first material of the method of Example 11 is greater than a concentration in the first material before the annealing.

In Example 14, forming the transistor of any of the methods of Examples 11-13 includes forming at least one source and one drain in the second material.

In Example 15, forming the transistor of the method of Example 14 further includes forming a gate stack on a channel in the second material defined between the at least one source and one drain.

In Example 16, forming the second material of the method of Example 14 includes forming a semiconductor body on the first material and forming the transistor includes forming the gate stack so that the gate stack contacts at least two adjacent sides of the semiconductor body.

In Example 17, introducing an implant into the second material of any of the methods of Examples 11-16 precedes forming the transistor.

In Example 18, the anneal of any of the methods of Examples 11-17 includes a temperature greater than 800° C.

In Example 19, following introducing the second material of any of the methods of Examples 11-18 includes a first concentration of the implant and after annealing, the second material includes a second concentration that is an order of magnitude different from the first concentration.

In Example 20,

20. A complementary metal oxide semiconductor (CMOS) circuit including at least one P-type device formed by any of the methods of Examples 11-19 and at least one N-type device formed by any of the methods of Examples 11-19.

The above description of illustrated implementations, including what is described in the Abstract, is not intended to be exhaustive or to limit the invention to the precise forms disclosed. While specific implementations of, and examples for, the invention are described herein for illustrative purposes, various equivalent modifications are possible within the scope, as those skilled in the relevant art will recognize.

These modifications may be made in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

The invention claimed is:

1. A transistor comprising:
   a gate stack and a source and a drain on opposing sides of the gate stack; and
   a first material and a second material on the substrate, the first material disposed between the substrate and the second material, and the channel of the transistor is defined in the second material between the source and the drain, wherein the first material and the second material each comprise an implant and the implant comprises a greater solubility in the first material than in the second material, wherein the second material has a concentration of the implant at least an order of magnitude less than a concentration of the implant in the first material, and wherein (i) the first material comprises silicon and the second material comprises germanium, or (ii) the first material comprises a first III-V material and the second material comprises a second III-V material different than the first III-V material.

2. The transistor of claim 1, wherein a segregation coefficient of the first material to the second material for the implant is greater than one.

3. The transistor of claim 1, wherein the at least one source and one drain are formed in the second material.

4. The transistor of claim 3, wherein the second material comprises a semiconductor body and the gate stack contacts at least two adjacent sides of the semiconductor body.

5. A complementary metal oxide semiconductor (CMOS) circuit comprising at least one P-type transistor device of claim 1 and at least one N-type transistor device of claim 1.

6. An integrated circuit structure comprising: a first material layer and a second material layer on a substrate, wherein the first material layer is disposed between the second material layer and the substrate, wherein (i) the first material comprises silicon and the second material comprises germanium, or (ii) the first material comprises a first III-V material and the second material comprises a second III-V material different than the first III-V material; and a transistor comprising a channel in the second material layer, the transistor comprising a gate stack and at least one source and one drain on opposing sides of the channel, wherein the first material layer comprises an implant such that the first material layer inhibits an off-state leakage current of the transistor, and wherein the second material has a concentration of the implant at least an order of magnitude less than a concentration of the implant in the first material; wherein the implant comprises a greater solubility in the first material layer than in the second material layer.

7. The integrated circuit structure of claim 6, wherein a segregation coefficient of the first material layer to the second material layer for the implant is greater than one.

8. The integrated circuit structure of claim 6, wherein the second material layer comprises a semiconductor body and the gate stack contacts at least two adjacent sides of the semiconductor body.

9. A complementary metal oxide semiconductor (CMOS) circuit comprising at least one P-type transistor device of claim 6 and at least one N-type transistor device of claim 6.

10. A method for forming an integrated circuit structure comprising:
    forming a first material on a substrate;

forming a second material on the first material, wherein (i) the first material comprises silicon and the second material comprises germanium, or (ii) the first material comprises a first III-V material and the second material comprises a second III-V material different than the first III-V material;

introducing an implant into the second material, wherein the implant comprises a greater solubility in the first material than in the second material;

annealing the substrate to form the second material having a concentration of the implant at least an order of magnitude less than a concentration of the implant in the first material; and forming a transistor on the substrate, the transistor comprising a channel comprising the second material.

11. The method of claim 10, wherein a segregation coefficient of the first material to the second material for the implant is greater than one.

12. The method of claim 10, wherein after the annealing, a concentration of the implant in the first material is greater than a concentration in the first material before the annealing.

13. The method of claim 10, wherein forming the transistor comprises forming at least one source and one drain in the second material.

14. The method of claim 13, wherein forming the transistor further comprises forming a gate stack on a channel in the second material defined between the at least one source and one drain.

15. The method of claim 13, wherein forming the second material comprises forming a semiconductor body on the first material and forming the transistor comprises forming the gate stack so that the gate stack contacts at least two adjacent sides of the semiconductor body.

16. The method of claim 10, wherein introducing an implant into the second material precedes forming the transistor.

17. The method of claim 10, wherein the annealing comprises a temperature greater than 800° C.

18. A complementary metal oxide semiconductor (CMOS) circuit comprising at least one P-type device formed by the method of claim 10 and at least one N-type device formed by the method of claim 10.

* * * * *